Jan. 27, 1970

A. G. BOSE 3,492,503

SWITCHING CIRCUITRY FOR REDUCING THE TIME REQUIRED TO TURN OFF A SATURATED SEMICONDUCTOR DEVICE

Filed Aug. 9, 1966

INVENTOR

AMAR G. BOSE

BY Wolf, Greenfield & Hieken

ATTORNEYS

United States Patent Office 3,492,503

Patented Jan. 27, 1970

3,492,503

SWITCHING CIRCUITRY FOR REDUCING THE TIME REQUIRED TO TURN OFF A SATURATED SEMICONDUCTOR DEVICE

Amar G. Bose, 17 Erie Drive, Chestnut Hill, Mass. 01762

Filed Aug. 9, 1966, Ser. No. 571,206

Int. Cl. H03k *17/04*

U.S. Cl. 307—254 14 Claims

ABSTRACT OF THE DISCLOSURE

A transistor switching circuit includes a transformer having a primary and tapped secondary. One end of the secondary winding is connected to the transistor collector by a clamping diode. The other end of the secondary winding is connected to the transistor emitter. The secondary winding tap is connected to the transistor base. This circuit arrangement keeps the emitter-collector potential from being less than a minimum magnitude slightly greater than the emitter-collector potential just necessary to establish saturated conduction.

Figure 1:
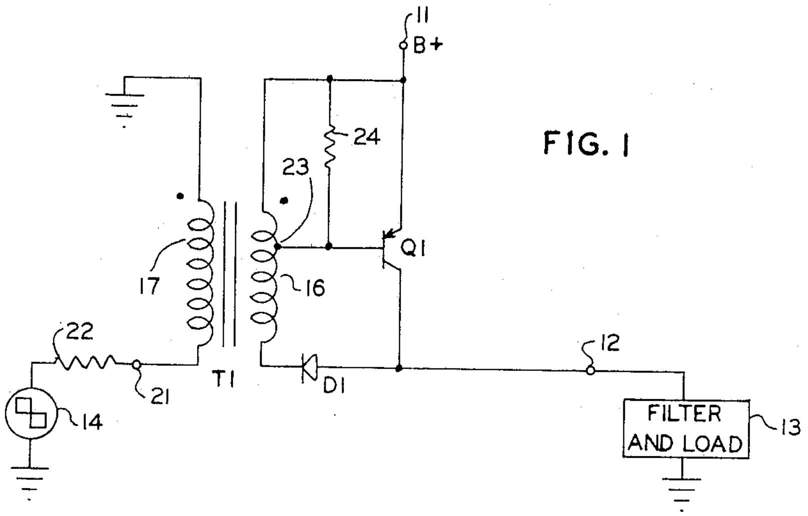

The present invention relates in general to switching circuitry and more particularly concerns novel techniques for effecting a marked reduction in the time required to render nonconductive a heavily conducting semiconductor device with a transformer-coupled drive circuit that facilitates employing like switching transistors to alternately connect positive and negative direct potentials to an output terminal.

It has long been recognized that a semiconductor device may be brought from nonconduction to saturation conduction in a much shorter time than required to change the device from saturation conduction to nonconduction. This property is believed to be caused by the large number of excess carriers present in the base region when a typical semiconductor device is saturated. These numerous excess carriers must evidently be withdrawn from the base region to induce nonconduction. Stated in other words, there seems to be an excess of carriers in the base region over the number necessary required to sustain saturation conduction which require a finite time for removal that contributes to the total time required to remove enough carriers to render a device nonconductive.

Still another problem in connection with switching circuitry where it is desired to alternately and rapidly connect positive and negative potentials to an output terminal resides in the conventional usage of complementary semiconductor switching devices to effect this result. Thus, it is not uncommon to have a PNP device for coupling the positive potential to the output terminal and an NPN device for coupling the negative potential to the output terminal.

Accordingly, it is an important object of this invention to provide improved circuitry for reducing the time required to switch off a semiconductor device conducting in its saturation region.

It is another object of the invention to achieve the preceding object with transformer drive.

It is still a further object of the invention to achieve the preceding objects with circuitry capable of switching positive and negative potential sources to an output terminal with switching transistors of the same type.

It is another object of the invention to achieve the preceding objects with high power high speed switching transistors that are relatively low in cost.

It is still a further object of the invention to achieve the preceding objects with reliable circuitry that requires no adjustment and is relatively low in cost, low in bulk, low in weight and low in the total number of components.

According to the invention, a semiconductor device having at least base, emitter and collector electrodes is rendered alternately conductive and nonconductive. Means are provided for preventing the potential across the device, when conducting, from falling below a predetermined value, typically slightly greater than the emitter-collector potential just necessary to establish saturation current. This means is believed to result in the establishment of a field in the device sufficient to prevent the gathering of excess carriers in the base region.

According to another feature of the invention, the means for rendering the device alternately conductive and nonconductive and establishing the desired minimum limiting potential across the device comprises transformer means. Two semiconductor devices of like type coupled to such transformer means are, according to the invention, arranged to rapidly and alternately switch positive and negative potential sources to an output terminal.

Figure 2:
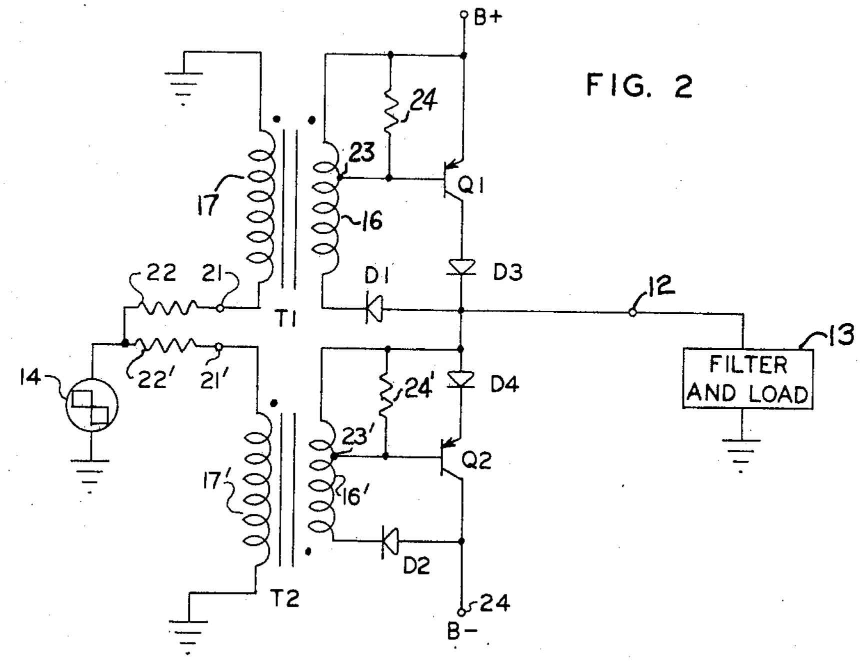

Numerous other features, objects and advantages of the invention will become apparent from the following specification when read in connection with the accompanying drawing in which:

FIG. 1 is essentially a schematic circuit diagram of a preferred embodiment of the invention; and FIG. 2 illustrates a preferred circuit according to the invention in which two circuits like that of FIG. 1 coact to alternately and rapidly switch potentials of opposite polarity to an output terminal.

With reference now to the drawing and more particularly FIG. 1 thereof, there is shown a schematic circuit diagram of an exemplary embodiment of the invention for alternately connecting the B+ potential on terminal 11 to output terminal 12 by rendering transistor Q1 alternately conductive and nonconductive and thereby delivering pulses of current to load 13 as rectangular wave voltage source 14 alternately swings positive and negative.

The emitter of transistor Q1 is connected to B+ terminal 11 and its collector is connected to output terminal 12. Secondary winding 16 of transformer T1 is connected from B+ terminal 11 to the cathode of clamping diode D1. The anode of diode D1 is connected to the collector of transistor Q1.

The primary winding 17 of transformer T1 is connected between ground and driving signal input terminal 21. An isolating resistor 22 is connected between rectangular signal source 14 and input terminal 21.

The base of transistor Q1 is connected to tap 23 of secondary winding 16. A base resistor 24 is connected between the emitter of transistor Q1 and its base.

Having described the circuit arrangement, its mode of operation will be discussed. A known property of semiconductor switching devices is that turn-on from nonconducting to saturation can be effected in less time than turn-off from the saturated conducting state to the nonconducting state. It is believed that one reason for encountering the difficulty in rapidly turning a saturated device off is that the base region contains carrier during saturation in excess of the number just necessary to maintain saturated conduction. The present invention is believed to help reduce the off switch time by preventing excess carriers from being present in the base region during saturated conduction. This result is accomplished by maintaining the electric field in the device sufficiently strong so that excess carriers tend to flow into the collector region instead of loitering in the base region. This field is believed to be established by keeping the emitter-collector potential from being less than a predetermined minimum magnitude, typically a minimum magnitude slightly greater than the emitter-collector potential just necessary to establish saturated conduction. If secondary winding 16 is considered to be an autotransformer that multiplies the base emitter potential across upper portion 22 by a factor $a$ to produce a potential $aV_{be}$ across the entire secondary winding 16, $aV_{be}-V_d$ (the potential drop across diode D1) is slightly greater than the collector-emitter saturation potential, $V_{ceSAT}$. Since the base-emitter potential of a heavily conducting transistor is very nearly constant, the desired predetermined potential at which diode D1 conducts may be established with rather good accuracy, and, in any event, sufficient to markedly reduce the turn-off time of transistor Q1.

Considering now a typical cycle of operation, it is convenient to initially assume that transistor Q1 is heavily conducting. Should the collector of transistor Q1 attempt to go more positive than $aV_{be}$ below the B+ potential on terminal 11, diode D1 conducts until the collector potential of transistor Q1 drops sufficiently so that at least $V_{ceSAT}$ is then across transistor Q1 while conducting into saturation. This maintenance of potential across transistor Q1 is believed to maintain the field inside the device sufficiently strong to exclude most excess carriers from the base region so that the driving signal for turning the device off need only remove just the number of carriers in the base region necessary to maintain saturated conduction.

Turn-off occurs when pulse source 14 provides a positive pulse that makes the base of transistor Q1 sufficiently positive to cut that transistor off and allow the collector of transistor Q1 to become less positive. Clamping diode D1 allows the emitter-collector potential across transistor Q1 to be as large as external circuit conditions dictate.

When rectangular pulse source 14 swings negative, the base of transistor Q1 becomes sufficiently negative to cause transistor Q1 to rapidly reach saturation while again activating diode D1 so that it performs its clamping function of keeping the emitter-collector potential magnitude at leas as great as $V_{ceSAT}$.

Referring to FIG. 2, there is shown an embodiment of the invention in which two circuits essentially of the type shown in FIG. 1 coact to alternately switch output terminal 12 between the positive potential on terminal 11 and the negative potential on terminal 24 with transistors Q1 and Q2 being identical PNP transistors. The reference numerals in FIG. 1 identify corresponding elements in FIG. 2. Since the circuit elements associated with transistor Q2 are so similar to those associated with transistor Q1, operation of the circuitry of FIG. 2 is best understood by noting the slight differences in connections in the lower half of the circuitry associated with transistor Q2 from upper half of the circuitry associated with transistor Q1.

The emitter of transistor Q2 is connected by diode D4 to output terminal 12 and its collector is connected to B— terminal 24 to maintain the proper polarity of voltage across a PNP transistor. The relative sense of secondary winding 16′ and primary winding 17′ in this example is reversed from that of secondary winding 16 and primary 17 so that the conductive and nonconductive states of transistors Q1 and Q2 will occur in alternate mutually exclusive time intervals to effect the desired swing of the potential on output terminal 12 essentially between B+ and B—. The transformers T1 and T2 are themselves identical. The end of primary winding 17′ farther from base tap 23′ is connected to ground. Finally, the collector of transistor Q1 is preferably connected by diode D3 to output terminal 12.

In an exemplary embodiment of the invention, transistors Q1 and Q2 are type 2N1908 power transistors. Diodes D1 and D2 are type 1N4148 diodes. Diodes D3 and D4 are type TA1115 diodes. Transformers T1 and T2 comprise a primary winding with 30 turns of number 28 wire, a secondary winding of 25 turns of number 26 wire with the base tap 5 turns from one end wound on Ferroxcube type 1811–3E core material in a type 1811HD hardware mounting. Source resistors 22 and 22′ were 200 ohm resistors, and base resistors 24 and 24′ were 33 ohm resistors.

It is evident that those skilled in the art may now make numerous modifications and uses of and departures from the specific embodiments and techniques disclosed herein without departing from the inventive concepts. Consequently, the invention is to be construed as limited to each and every novel feature and novel combination of features present in or possessed by the apparatus and techniques disclosed herein and by the spirit and scope of the appended claims.

What is claimed is:

1. Electrical apparatus comprising, a first output semiconductor device having at least base, emitter and collector electrodes and characterized by a saturation potential between said collector and emitter electrodes corresponding to the emitter-collector potential thereof when said device first saturates, first transformer means having at least first output winding means having a first portion coupled between said emitter electrode and said base electrode whereby the potential developed across said first output winding means is a predetermined multiple of the potential between said base and emitter electrodes, and means for coupling said collector electrode to said first output winding means which coupling means includes means for preventing the potential between said emitter and collector electrodes from being less than said predetermined multiple of the potential between said base and emitter electrodes and sufficient to establish saturated conduction in said device.

2. Apparatus in accordance with claim 1 wherein said means for coupling said first device collector electrode to said first output winding means comprises a first unilaterally conducting device.

3. Apparatus in accordance with claim 2 wherein the difference between said predetermined multiple of the potential between said base and emitter electrodes and the potential across said unilaterally conducting device corresponds to a potential slightly greater than said saturation potential.

4. Apparatus in accordance with claim 3 wherein said transformer means further comprises first primary winding means and further comprising, means for applying a pulse of energy to said first primary winding means sufficient to render said first semiconductor device into conductive saturation.

5. Apparatus in accordance with claim 1 wherein said first output winding means includes a second portion coupled between said base electrode and said collector electrode, said first and second portions being in series.

6. Apparatus in accordance with claim 5 wherein said first output winding means comprises a secondary winding having a tap connected to siad base, one end connected to said emitter and the other end coupled to said device by unilaterally conducting means.

7. Electrical apparatus comprising, an output terminal, a common terminal, sources of first and second potentials of opposite polarity with respect to the potential on said common terminal, first and second semiconductor devices of like type each having at least base, emitter and collector electrodes, means for coupling the collector of said first semiconductor device and the emitter of said second semiconductor device to said output terminal, means for coupling the emitter electrode of said first device to said first direct potential source, means for coupling the collector of said second semiconductor device to said second source of direct potential, first transformer means for applying input pulses between the base and emitter electrodes of said first semiconductor device to control the conductive state of said first semiconductor device, second transformer means for applying input pulses between the base and emitter electrodes of said second semiconductor device to control the conductive state of said second semiconductor device, and means for applying energy pulses to said first and second transformer means to render said first and second semiconductor devices alternately conductive during mutually exclusive time intervals, each of said semiconductor devices being characterized by a saturation potential between said collector and emitter electrodes corresponding to the emitter-collector potential thereof when said device first saturates and each of said transformer means comprising first output winding means having a first portion coupled between the emitter electrode and the base electrode of an associated one of said semiconductor devices whereby the potential developed across the first output winding means is a predetermined multiple of the base-emitter potential of an associated one of said semiconductor devices, and means for coupling the collector electrode of an associated one of said semiconductor devices to said first output winding means which coupling means includes means for preventing the emitter-collector potential of an associated one of said semiconductor devices from being less than said predetermined multiple of said base-emitter potential and sufficient to establish saturated conduction in the associated device.

8. Apparatus in accordance with claim 7 wherein each of said means for coupling a connector electrode to an associated first output winding means comprises a unilaterally conducting device.

9. Apparatus in accordance with claim 8 wherein the difference between said predetermined multiple of said base-emitter potential and the potential across said unilaterally conducting device corresponds to a potential slightly greater than said saturation potential.

10. Apparatus in accordance with claim 9 wherein each of said transformer means further comprises first primary winding means and further comprising, means for applying energy pulses to both said first primary winding means sufficient to render each of said semiconductor devices into conductive saturation during mutually exclusive time intervals.

11. Apparatus in accordance with claim 7 wherein each of said output winding means includes a second portion coupled between the base electrode and the collector electrode of the associated device, said first and second portions being in series.

12. Apparatus in accordance with claim 11 wherein said output winding means comprises a secondary winding having a tap connected to the base of the associated device, and each end of said secondary winding coupled to a respective one of the emitter and collector electrodes of the associated device.

13. Apparatus in accordance with claim 11 wherein one end of each secondary winding is coupled to the collector of the associated device by unilaterally conducting means.

14. Apparatus in accordance with claim 13 wherein a first of the secondary windings is connected to the emitter of said first device and the other end of that secondary winding is coupled to the first device collector by first and second unilaterally conducting devices connected in series, and one end of a second of the secondary windings is coupled to the second device emitter by a third semiconductor device connected to the junction of said first and second unilaterally conducting devices and the other end of said second secondary winding is coupled to the second device collector by a fourth unilaterally conducting device.

References Cited

UNITED STATES PATENTS 3,289,008 11/1966 Sommerfield ----- 307—254 X

DONALD D. FORRER, Primary Examiner

U.S. Cl. X.R.

307—253